US007999753B2

(12) United States Patent
Gaucher et al.

(10) Patent No.: US 7,999,753 B2
(45) Date of Patent: *Aug. 16, 2011

(54) APPARATUS AND METHODS FOR CONSTRUCTING ANTENNAS USING VIAS AS RADIATING ELEMENTS FORMED IN A SUBSTRATE

(75) Inventors: Brian Paul Gaucher, Brookfield, CT (US); Duixian Liu, Yorktown Heights, NY (US); Ullrich Richard Rudolf Pfeiffer, Carmel, NY (US); Thomas Martin Zwick, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 223 days.

This patent is subject to a terminal disclaimer.

(21) Appl. No.: 12/176,975

(22) Filed: Jul. 21, 2008

(65) Prior Publication Data

US 2008/0272977 A1    Nov. 6, 2008

Related U.S. Application Data

(63) Continuation of application No. 10/731,520, filed on Dec. 9, 2003, now Pat. No. 7,444,734.

(51) Int. Cl.
*H01Q 1/38* (2006.01)
*H01Q 9/40* (2006.01)

(52) U.S. Cl. ......... 343/828; 343/846; 343/873; 343/899
(58) Field of Classification Search ........... 343/700 MS, 343/702, 752, 860, 828, 846, 873, 899
See application file for complete search history.

(56) References Cited

U.S. PATENT DOCUMENTS

| 4,672,386 | A | * | 6/1987 | Wood ........................... 343/770 |
| 4,819,004 | A | * | 4/1989 | Argintaru et al. ............. 343/778 |
| 4,924,236 | A | * | 5/1990 | Schuss et al. .......... 343/700 MS |
| 5,903,239 | A |   | 5/1999 | Takahashi et al. |
| 6,888,502 | B2 | * | 5/2005 | Beigel et al. ........... 343/700 MS |
| 7,444,734 | B2 | * | 11/2008 | Gaucher et al. ................. 29/600 |

OTHER PUBLICATIONS

Mongia, R.K., Small Electric Monopole Mode Dielectric Resonator Antenna, Electronic Letters, vol. 32, Issue 11, May 23, 1996, pp. 947-949, Digital Object Identifier.

* cited by examiner

*Primary Examiner* — Michael C Wimer
(74) *Attorney, Agent, or Firm* — F. Chau & Associates, LLC; Anne V. Doughterty, Esq.

(57) ABSTRACT

Antennas are provided which are constructed using one or more conductive via stubs as radiating elements formed in a substrate. The antennas can be integrally packaged with IC chips (e.g., IC transceivers, receivers, transmitters, etc.) to build integrated wireless or RF (radio frequency) communications systems.

22 Claims, 9 Drawing Sheets

APPARATUS AND METHODS FOR CONSTRUCTING ANTENNAS USING VIAS AS RADIATING ELEMENTS FORMED IN A SUBSTRATE

CROSS-REFERENCE TO RELATED APPLICATION

This is a Continuation Application of U.S. application Ser. No. 10/731,520, filed on Dec. 9, 2003, now U.S. Pat. No. 7,444,734, the disclosure of which is herein incorporated by reference in their entirety.

TECHNICAL FIELD OF THE INVENTION

The present invention relates generally to antennas for wireless or RF (radio frequency) communications systems and, more specifically, antennas that are constructed using one or more conductive via stubs as radiating elements formed in a substrate, as well as apparatus and methods for packaging such antennas with IC (integrated circuit) chips.

BACKGROUND

To provide wireless connectivity and communication between devices in a wireless network such as a wireless PAN (personal area network), a wireless LAN (local area network) a wireless WAN (wide area network), a cellular network, or virtually any radio network or system), it is necessary to equip the receivers and transmitters (or transceivers) with antennas in order to efficiently radiate (transmit) or receiver the desired signals to/from other elements of the network.

There are many types of antennas that are used in such communications networks and systems. For example, monopole antennas are commonly used in wireless or RF communications systems. In general, a monopole antenna comprises a single wire or antenna element over a ground plane, inversely proportional in length to its intended frequency of operation, which is coupled to a transmitter, receiver or transceiver within a wireless device. The signals transmitted from a monopole antenna are omnidirectional in nature (i.e., the signal is sent with approximately the same signal strength in all directions in a generally horizontal plane). Moreover, reception of a signal with a monopole antenna element is omnidirectional. Typically, in radio communications systems, monopole antennas are remotely disposed separate from the integrated circuits within the transmitters, receivers or transceivers due to size limitations or usage scenarios, for example.

SUMMARY OF THE INVENTION

Exemplary embodiments of the present invention generally include antennas that are constructed using one or more conductive via stubs as radiating elements formed in a substrate. More specifically, in one exemplary embodiment of the invention, a method for constructing an antenna comprises providing a substrate having first and second surfaces, which is are substantially parallel, and forming a radiating element in the substrate by forming a via hole through the substrate between the first and second surfaces and filling the via hole with a conductive material to form a conductive via stub.

In one exemplary antenna framework according to the invention, a monopole antenna can be constructed, which comprises a single conductive via stub formed in a substrate (e.g., dielectric substrate or semiconductor substrate) and a conductive layer (ground plane) formed on a surface of the substrate. In one exemplary embodiment, the ground plane (or any other conductive ground element) can be formed on a substrate surface by depositing a conductive layer on a surface of the substrate and patterning the conductive layer to form a ground plane, which is electrically isolated from the conductive via stub, and to form a contact pad on an end portion of the conductive via stub, which is electrically isolated from the ground plane.

In another exemplary embodiment of the invention, an antenna having a plurality of radiating elements, such as a directional antenna (e.g., a phased array antenna), can be constructed by forming a plurality of conductive via stubs as radiating elements in a substrate.

In yet other exemplary antenna frameworks according to the invention, antenna radiating elements may be formed to comprises one or more conductive via stub elements formed in a substrate and one or more conductive elements formed on a surface of the substrate, which connect to end portions of the conductive via stubs exposed on the substrate surface. For example, in one exemplary embodiment, a top-loaded monopole antenna comprises a radiating element that includes a single conductive via stub and a patterned conductive element, which is formed on a surface of the antenna substrate and connected to the via stub. The patterned conductive elements may comprise conductive pad elements or conductive strip elements. In other exemplary embodiments of the invention, antennas such as inverted-F antennas and multiband antennas can be constructed using radiating elements formed from conductive via stubs and conductive elements that are formed on the substrate surface and connected to the exposed end portions of the via stubs.

Exemplary embodiments of the present invention further include devices and methods for constructing wireless or RF (radio frequency) communications systems by integrally packaging antennas (which are constructed using one or more vias formed in a substrate) together with IC chips (e.g., IC transceivers, receivers, transmitters, etc.).

These and other exemplary embodiments, aspects, objects, features and advantages of the present invention will be described or become apparent from the following detailed description of exemplary embodiments, which is to be read in connection with the accompanying drawings.

DETAILED DESCRIPTION OF EXEMPLARY EMBODIMENTS

Exemplary embodiments of the invention include antennas that are constructed using one or more conductive via stubs as radiating elements, which are formed in a substrate, as well as methods for forming such antennas. For example, exemplary embodiments of the invention include monopole antennas that can efficiently operate at, e.g., RF and microwave frequencies, and which have electrical characteristics (e.g., gain or radiation efficiency, omni-directional radiation patterns, antenna impedance, etc.) that render the monopole antennas suitable for voice communication, data communication or RADAR applications, for example.

Exemplary embodiments of the invention further include apparatus and methods for packaging antennas with IC (integrated circuit) chips (e.g., transceiver) to construct IC packages for, e.g., wireless communications applications.

In particular, antennas that are constructed using one or more conductive via stubs as radiating elements formed in a substrate according to embodiments of the invention, can be integrally packaged with IC chips (e.g., transceiver IC chip) in a relatively small package similar in size to that of existing leaded carriers or leadless chip carriers for, e.g., transceiver ICs. Indeed, by way of example, antennas according to the invention which are designed to operate at resonant frequencies of about 20 GHz or greater are sufficiently small to be packages with such existing IC chips.

Figure 1A:
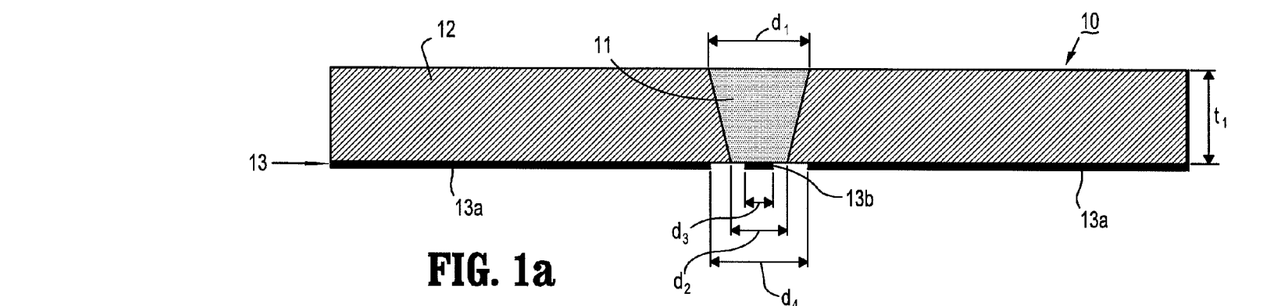
FIGS. 1A and 1B are schematic diagrams illustrating an antenna according to an exemplary embodiment of the present invention.
Figure 1B:
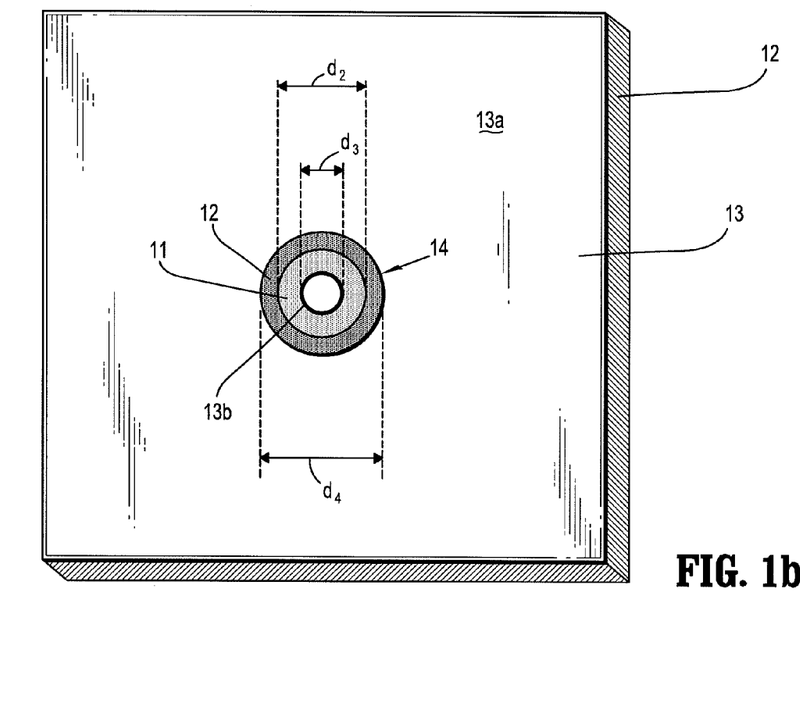

FIGS. 1A and 1B are schematic diagrams illustrating an antenna according to an exemplary embodiment of the present invention. In particular, FIG. 1A is a cross-sectional schematic view of an antenna (10) comprising a conductive via stub (11) as a radiating element formed in a planar substrate (12) having a thickness ($t_1$). The substrate (12) may comprise any suitable material including, for example, dielectric/insulative materials such as fused silica ($SiO_2$), alumina, polystyrene, ceramic, teflon based substrates, FR4, etc., or semiconductor materials such as high resistivity silicon or GaAs, etc., depending on the antenna implementation.

In FIG. 1A, the via stub (11) is illustrated as having a slight conical cross-sectional shape having a first diameter ($d_1$) and a second (smaller) diameter ($d_2$), which typically results when a via hole is formed through a dielectric substrate using a laser drilling process, for example. In general, the via stub (11) may be formed by etching/drilling a via hole in a substrate and then filling the via hole with a conductive material such as copper or gold, for example, using methods known to those of ordinary skill in the art.

The antenna (10) further comprises a conductive layer (13) (e.g., a thin metallic film) which is deposited on a surface of the substrate (12) (e.g., the lower surface as depicted in FIG. 1A) and patterned to form a ground plane (13a) and a contact pad (13b) (which is electrically isolated from the ground plane (13a)). The contact pad (13a) is formed on an exposed end of the via stub (11) (radiating element) to provide a means for making electrical contact to the via stub (11). In one exemplary embodiment of the invention, the conductive layer (13) is formed by depositing a thin layer of the same metal (e.g., gold) used to form the via stub (11), although any suitable conductive material may be used depending on the application.

FIG. 1B is a schematic diagram illustrating a bottom view of the antenna (10) of FIG. 1A, according to one exemplary embodiment of the invention. FIG. 1B schematically illustrates the conductive layer (13) being formed on an entire surface of the substrate (12), wherein the substrate (12) is square-shaped and wherein the conductive via stub (11) is formed in substantially the center region of the substrate (12). FIG. 1B further schematically illustrates an exemplary conductive layer (13) pattern comprising ground plane (13a) and contact pad (13b) patterns that are formed by removing a center annular region of the conductive layer (13) to expose portions of the via stub (11) and substrate (12). The exemplary embodiment of FIG. 1B illustrates the contact pad (13b) having a circular shape with diameter ($d_3$), which is formed on the end portion of the via stub (11) having a circular shape with diameter ($d_2$), wherein the circular contact pad (13b) and circular end portion of the via stub (11) have substantially the same radius center origin. Moreover, the exemplary ground plane (13b) pattern comprises a circular-shaped inner-edge portion (14) having a diameter ($d_4$) and having substantially the same radius center origin as the contact pad (13b) and via stub (11). It is to be understood that FIGS. 1A and 1B are merely illustrative and that the conductive layer (13) can be patterned to form a square-shaped contact pad (13b) and square-shaped inner-edge portion (14), for example. In addition, the substrate (12) can be round or rectangular, for example, as opposed to square-shaped as depicted in FIG. 1B.

It is to be appreciated the exemplary antenna frameworks depicted in FIGS. 1A and 1B can be used for constructing various types of antennas such as monopole antennas (having a single radiating via stub element over a ground plane as depicted) or directional antennas (having an array of radiating via stub elements formed in a substrate). For example, using the frameworks depicted in FIGS. 1A and 1B, a monopole antenna that operates at RF and/or microwave frequencies, for example, can be constructed using a single via stub (11) (radiating element) formed in a center region of a substantially square-shaped (or other shape) substrate (12) having a ground plane (13a) and contact pad (13b) as shown.

Those of ordinary skill in the art will readily appreciate that electrical characteristics (e.g., antenna impedance, resonant frequency, bandwidth, radiation pattern, etc.) of a monopole antenna having an architecture similar to that depicted in FIGS. 1A and 1B, for example, will vary depending on various factors. For example, as explained in detail below, the various dimensions (e.g., $d_1$-$d_4$) and/or the dielectric constant and/or thickness ($t_1$) of the material used to form the substrate (12), can be selected to achieve desired or optimal antenna characteristics, depending on the intended antenna implementation.

More specifically, by way of example, the resonant frequency of the exemplary monopole antenna (10) is based primarily on the length of the radiating via stub element (11) and the dielectric constant of the substrate (12) material. In the exemplary embodiment of FIG. 1a, the length of the via stub (11) is substantially equal to the thickness ($t_1$) of the substrate (12). Thus, for given material having a certain dielectric constant $\in_r$, the thickness ($t_1$) of the substrate (12) (i.e., length of the via stub (11)) would be selected based on the desired resonant frequency of the monopole antenna. For example, for a one-quarter wavelength monopole (first resonance) the thickness ($t_1$) of the substrate (12) would be approximately equal to $$\frac{\frac{1}{4}\lambda_0}{\sqrt{\varepsilon_r}},$$

where $\lambda_0$ is the free space wavelength (for the selected resonant frequency) and where $\varepsilon_r$ is the dielectric constant of the substrate (12). Moreover, for a one-half wavelength monopole (second resonance) the thickness ($t_1$) of the substrate (12) would be approximately equal to $$\frac{\frac{1}{2}\lambda_0}{\sqrt{\varepsilon_r}},$$

and so on.

Furthermore, the antenna impedance of a monopole antenna having an architecture such as depicted in FIGS. 1A and 1B, will depend on various factors, including, for example, the dielectric constant of the substrate (12). In particular, the impedance of a very thin quarter-wavelength monopole antenna in air (vacuum) with a relatively large ground plane will have a relatively low impedance (about 36 Ohms) at the center (resonant) frequency of the antenna (theoretically, an infinitely thin quarter-wavelength monopole antenna in air with an infinite ground plane will have an impedance of 36 Ohms at the center frequency). For the same resonant frequency, however, dielectric loading will cause the impedance of the thin monopole antenna to decrease at the resonant frequency. More specifically, for a given resonant frequency, the impedance of the antenna (10) at the resonant frequency decreases as the dielectric constant of the substrate (12) material increases.

Furthermore, for a given resonant frequency and substrate dielectric constant, a one-half wavelength monopole will have a greater impedance than a one-quarter wavelength monopole at the resonant frequency, as is well understood by those of ordinary skill in the art. Indeed, on a practical level, the impedance of a very thin half-wavelength monopole antenna in air (vacuum) with a relatively large ground plane will have an impedance of about several hundred Ohms at the center frequency of the antenna (theoretically, an infinitely thin half-wavelength monopole antenna in air with an infinite ground plane will have an infinite impedance at the center frequency). Again, dielectric loading together with finite thickness can be used to decrease the impedance of a thin, half-wavelength monopole antenna at the resonant frequency.

Furthermore, for a given resonant frequency, the bandwidth of the antenna typically decreases as the antenna (10) is constructed to operate at higher resonances (e.g., increasing the length of the via stub (11)). The efficiency of a monopole antenna will start to decrease as the impedance of the antenna becomes very low (due to a higher dielectric constant), such as in the range of 10-20 Ohms or below, or as the dielectric losses are increased (e.g., higher loss tangent).

Various computer simulations were performed (using various commercially available electromagnetic simulation applications including the HFSS™ application from Ansoft for a 60 GHz monopole antenna having an architecture similar to the exemplary embodiments of FIGS. 1A and 1B. As is known in the art, HFSS™ is a 3D EM simulation software tool for RF, wireless, packaging, and optoelectronic design. In particular, simulations were performed with the following parameters. A model antenna was defined for a 60 Ghz one-quarter wavelength monopole antenna comprising a radiating via stub element formed in the center of a 4 mm×4 mm substrate of fused silica (SiO2) having a thickness of 625 um (25 mil) with a ground plane formed on one surface of the substrate. The dielectric constant was set to 3.8, which is the dielectric constant of fused silica, and the dielectric losses (i.e., loss tangent) was assumed to be 0 (since fused silica has a very low loss tangent). The diameters $d_1$ and $d_2$ of the via stub were set to 300 um and 150 um, respectively.

Based on the above parameters, the computer simulations resulted in a relatively low impedance in the range, on average, of about 10 to about 15 Ohms at about 60 Ghz, which is expected due to loading the monopole with a dielectric such as fused silica (as opposed to air/vacuum).

It is to be understood that in practice, the antenna impedance can vary depending on, e.g., the manner in which the antenna is packaged or otherwise connected to other components. Various embodiments for packaging antennas and IC chips according to the invention will be described, for example, with reference to the exemplary embodiment of FIG. 3, which provide low interconnection losses sufficient for high-frequency operation.

Figure 4:
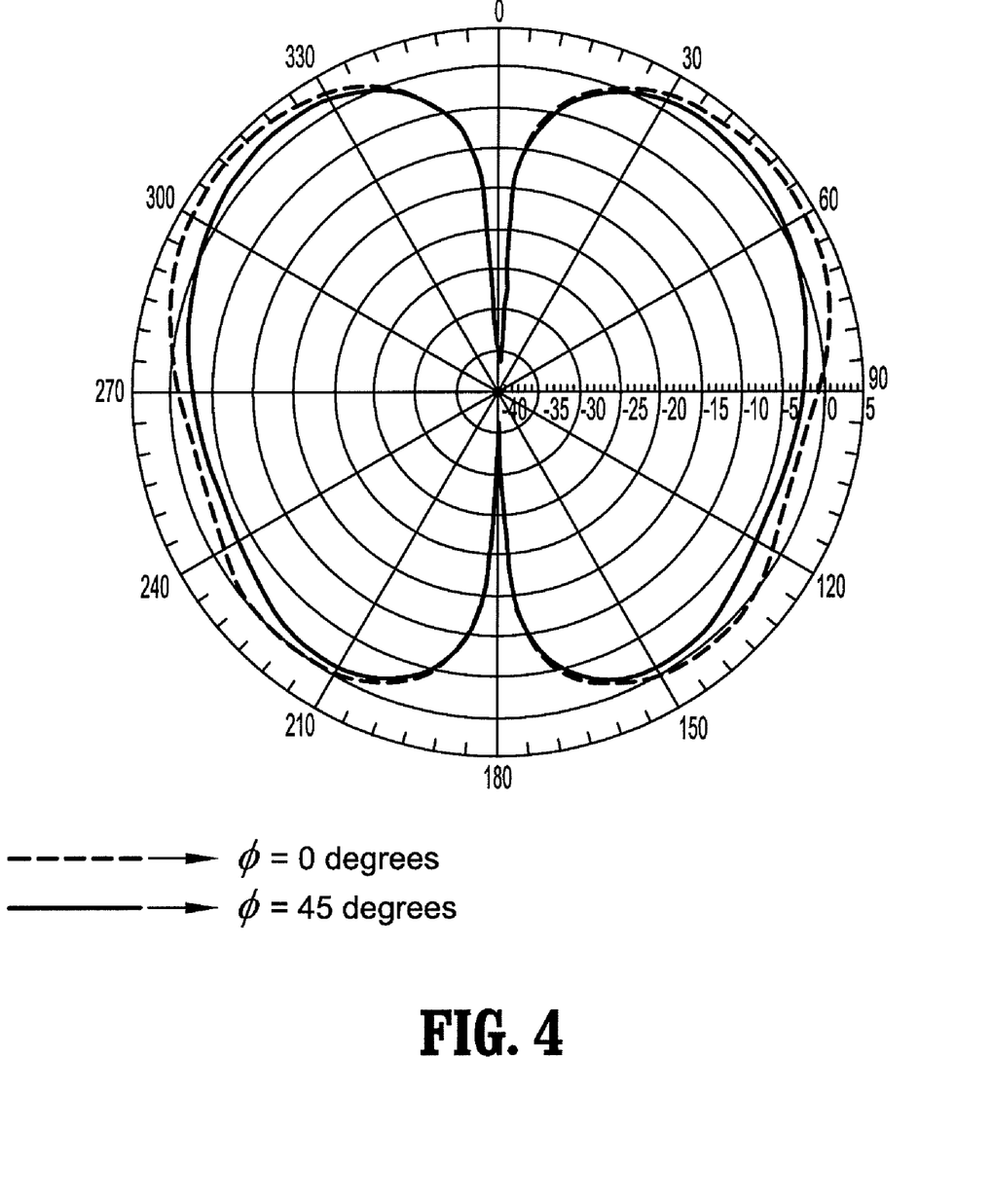
FIG. 4 is an exemplary diagram illustrating vertical radiation patterns obtained from a computer simulation of an antenna framework according to an exemplary embodiment of the invention.

In addition, the simulations resulted in radiation patterns that were substantially omni-directional. For example, FIG. 4 is an exemplary diagram illustrating a radiation pattern, which was obtained using the HFSS™ simulation tool from ANSOFT, for the above-defined antenna model of the 60 Ghz one-quarter wavelength monopole antenna comprising a radiating via stub element formed in the center of a 4 mm×4 mm substrate of fused silica (SiO2) having a thickness of 625 um (25 mil) with a ground plane formed on one surface of the substrate. With the simulation results shown in FIG. 4, a Cartesian coordinate system was defined having a Z-axis extending along a center longitudinal axis of the via stub (11) (i.e., perpendicular to the top and bottom surfaces of the substrate (12)), having an origin on the center longitudinal axis (Z-axis) of the via stub (11) equidistant from the top and bottom surfaces of the substrate (12), and having an X-axis and Y-axis extending parallel to the side surfaces of the square-shaped substrate (12).

FIG. 4 depicts vertical radiation patterns measured in different vertical planes rotated around the Z-axis. For example, the dotted line in FIG. 4 represents the vertical radiation pattern for a vertical plane defined by the ZX plane (phi=0 degrees) (e.g., the cross-sectional slice depicted in FIG. 1A) and the solid line represents the radiation pattern for a vertical plane (slice) at phi=45 degrees, i.e., a vertical plane that intersects the Z-axis but rotated about the Z-axis at an angle of 45 degrees from the ZX and ZY planes. The vertical radiation patterns depicted in FIG. 4 illustrate a close to omnidirectional pattern that results due to the ground plane being finite, although such radiation patterns depict acceptable omnidirectional radiation patterns.

A monopole antenna according to an exemplary embodiment of the invention, such as the 60 Ghz monopole antenna discussed above having a framework similar to that depicted in FIGS. 1A and 1B, can be designed to have a relatively low antenna impedance for use in particular applications in which low impedance antennas are desirable. Indeed, by way of example, the simulation results (as described above) for the 60 GHz, one-quarter wavelength via stub monopole in fused silica (dielectric constant=3.8) provided a relatively low antenna impedance (as low as about 10 Ohms). A low impedance monopole antenna according to the invention can be used, for example, in applications in which a monopole antenna is connected to the output of a MMW (millimeter-wave) power amplifier, since MMW power amplifiers typically have a low output impedance.

An antenna having a relatively low impedance, however, may not be suitable for certain applications. For example, as the antenna impedance decreases, antenna characteristics such as bandwidth can be adversely affected. Further, as the impedance decreases, the overall resistive losses increase. Accordingly, the efficiency of a monopole antenna can decrease as the antenna impedance decreases, which renders the antenna unsuitable for certain applications.

There are various applications, however, in which it is desirable to employ monopole antennas having higher antenna impedances (e.g., 50 Ohms, 75 Ohms). There are different methods according to exemplary embodiments of the invention, which can be employed for constructing monopole antennas having impedances that are optimized for the intended application. For example, in one exemplary embodiment of the invention of a monopole antenna having a framework similar to that depicted in FIG. 1A, for example, the thickness ($t_1$) of the substrate (12) can be increased to operate the monopole antenna at higher resonances (one-half wavelength or greater) for a given resonant frequency, which effectively increases the antenna impedance. For example, assuming a 60 GHz, one-half wavelength monopole antenna having a framework as depicted in FIG. 1A, assuming the same dielectric material, the thickness ($t_1$) of the substrate (12) would increase about 2× (i.e., the length of the radiating via stub (11) element would increase almost twofold), as compared to the thickness ($t_1$) of the substrate (12) for a 60 GHz, one-quarter wavelength monopole antenna having a framework as depicted in FIG. 1A. Thus, the impedance of a monopole antenna according to an embodiment of the invention can be adjusted by designing the antenna to operate at higher resonance modes for a desired resonant frequency.

Although the thickness ($t_1$) of the substrate (12) can be increased to obtain desired antenna impedances, depending on the application, a relatively thick substrate (12) can adversely affect the antenna characteristics (e.g., increased impedance and/or resistive losses, smaller bandwidth, etc.). Moreover, due to limitations of current state of the art semiconductor fabrication techniques, there are limitations to the maximum obtainable "aspect ratios" with regard to formation of via holes in substrates. Therefore, if the substrate (12) is too thick, a via stub (11) may be formed having diameters (e.g., $d_1$, $d_2$) that are too large, which can result in a higher capacitance at the antenna feed point and the existence of higher order modes. In addition, multiple resonances can occur.

Figure 2:
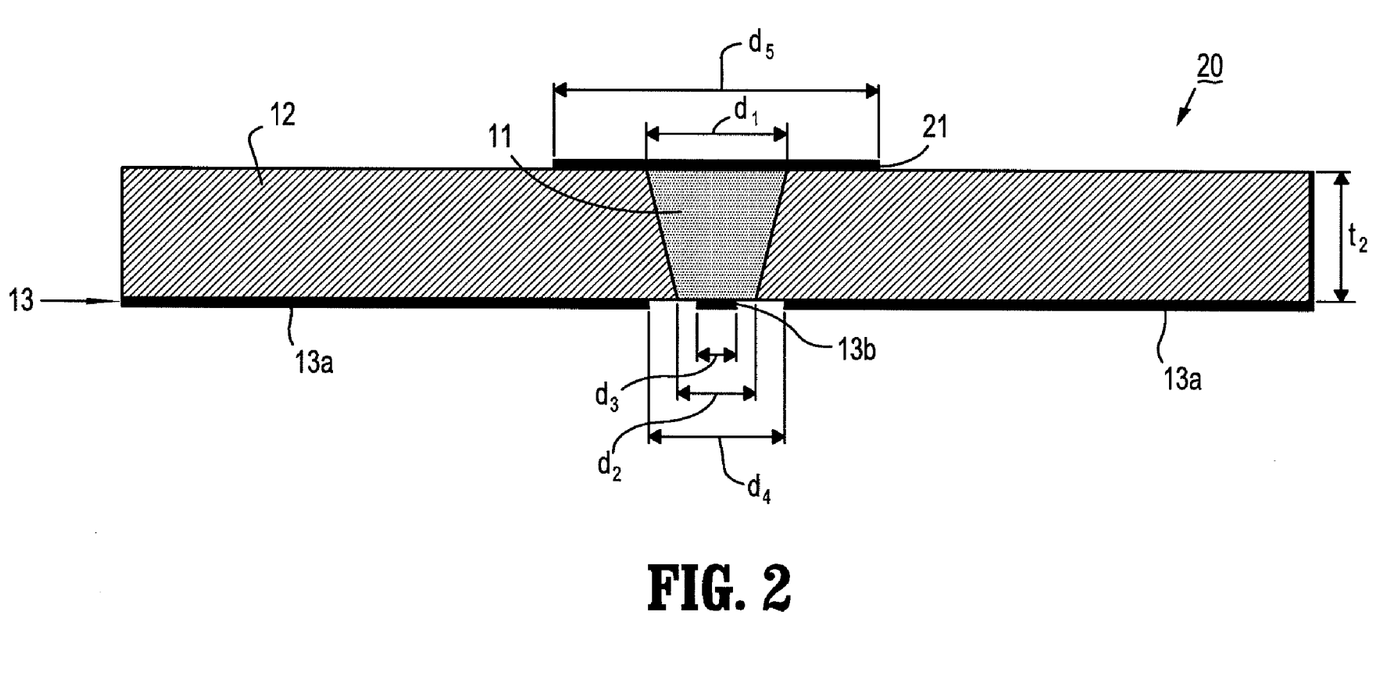
FIG. 2 is a schematic diagram illustrating an antenna according to another exemplary embodiment of the present invention.

FIG. 2 is a schematic diagram illustrating an antenna according to another exemplary embodiment of the invention. The antenna (20) depicted in FIG. 2 is similar to the antenna (10) depicted in FIG. 1, except that the radiating element of the antenna (20) comprises a via stub (11) and a pad or hat element (21) formed on an end portion of the via stub (11). The hat element (21) can be formed, for example, by depositing a layer of the same conductive material (e.g., gold) used to form the via stub (11) and then patterning the such conductive layer using methods known to those of ordinary skill in the art to form the hat element (21). In one exemplary embodiment, the hat element (21) comprises a round pad having a diameter ($d_5$) which is greater than the diameter ($d_1$) of the via stub (11). Further, in one exemplary embodiment, the hat element (21) comprises the same radius center origin as the via stub (11). In another exemplary embodiment, the hat element (21) can be square-shaped, for example.

The hat element (21) serves various purposes. For example, the hat element (21) can be used for effectively increasing the length of the radiating element (i.e., increase the length of the via stub (11)) to provide, e.g., a one-half wavelength monopole (second resonance) for a given resonant frequency, without having to increase the thickness of the substrate (12).

In particular, by way of example, the simulation results (as described above) for the 60 GHz, one-quarter wavelength via monopole in fused silica (dielectric constant=3.8) provided a relatively low antenna impedance (as low as about 10 Ohms). A computer simulation was performed for a 60 GHz, half-wavelength monopole antenna (having a framework as depicted in FIG. 2) using the same parameters as in the above simulation, but further including a hat element with a diameter ($d_5$) of 350 um. The results of such simulation yielded an impedance of about 75 Ohms at 60 GHz and a "bandwidth" (which is defined as the frequency range where the return loss is better than 10 dB) from 60 GHz to 70 GHz.

Accordingly, the above simulation results for 60 Ghz monopole antennas that are formed using the exemplary frameworks of FIGS. 1A-1B and FIG. 2 having substrates (12) of the same size (e.g., $t_1=t_2=625$ um) and material (fused silica) illustrate that a hat element (21) (FIG. 2) can be used to effectively increase the length of the radiating element to operate the antenna at the second resonance (at the desired resonance frequency) and thereby increase the antenna impedance, while maintaining the same thickness of the substrate ($t_1=t_2$). This is advantageous since, as noted above, relatively thinner substrates enable relatively small diameter via stubs to be formed.

Furthermore, the use of the hat element (21) to increase the length of the radiating element and generate a one-half (or greater) wavelength monopole antenna enables effective use of materials having relatively high dielectric constants, which further allows optimization of antenna impedance. For example, for the exemplary 60 Ghz, one-quarter wavelength monopole antenna (operating at first resonance) using fused silica substrate, as described above with reference to FIG. 1A, it may not be desirable to use a dielectric material having a dielectric constant greater than about 4-5, because the antenna impedance would decrease even more (lower than about 10 ohms) due to the higher dielectric constant. However, as a result of the higher impedance obtained using the hat element (21), the exemplary antenna framework of FIG. 2 enables the use of materials with higher dielectric constants than fused silica.

For example, in another exemplary embodiment of the invention, a 60 GHz monopole antenna can be constructed using the framework of FIG. 2, wherein the antenna (20) comprises a round hat element (21) having a diameter ($d_5$) of about 350 um and a substrate (12) made of alumina (dielectric constant of 9.7) having a thickness $t_2=375$ um. In this exemplary embodiment, the thickness ($t_2=375$ um) of the alumina substrate is significantly smaller than the thickness ($t_2=675$ um) of the fused silica substrate to compensate for the higher dielectric constant of alumina (9.7 as compared to 3.8 for fused silica). In a computer simulation of this exemplary embodiment yielded a "bandwidth" (which is defined as the frequency range where the return loss is better than 10 dB) from 55 GHz to 65 GHz and an antenna impedance of about 40 Ohms. The radiation pattern was similar to that as shown in FIG. 4. Thus, the above simulation results illustrate that depending on the implementation, the antenna impedance of monopole antenna, for example, can be adjusted by changing the length of the radiating element (using, e.g., the hat element) and/or selecting a material having a desired dielectric constant.

Another advantage of using the hat (21) is that the center frequency of a monopole antenna can be fine-tuned by tweaking the size ($d_5$) of the hat (21), as opposed to making slight adjustments to the length of the via stub (or substrate thickness). In particular, by way of example, for a given antenna design using the framework of FIG. 2, once the substrate material and thickness is selected for a given resonant frequency, various antenna prototypes can be made that only vary slightly in the diameter ($d_5$) of the hat element. In this manner, the electrical properties (e.g., bandwidth, center frequency, impedance, etc.) of the antenna prototypes can be tested and the prototype with the optimal properties can be selected for mass production.

Figure 7A:
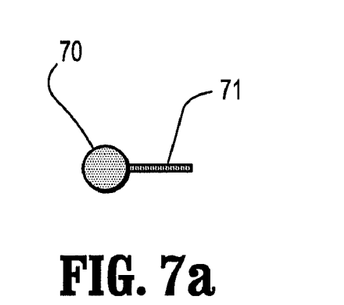
FIGS. 7A, 7B, 7C and 7D are exemplary diagrams illustrating radiating elements for antennas, according to various exemplary embodiments of the invention.
Figure 7B:
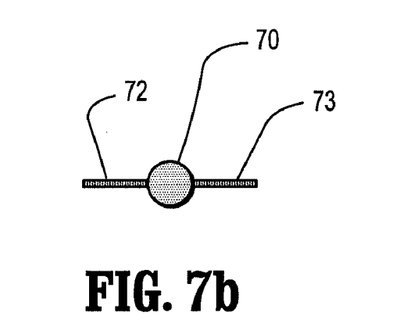

It is to be understood that the monopole antenna of FIG. 2 is one exemplary embodiment of a top-loaded monopole antenna framework, wherein the antenna radiating element comprises a round hat element and conductive via element, and that other antenna frameworks can be constructed in accordance with the teachings herein. For instance, FIGS. 7A-7D illustrate different antennas designs can be constructed using conductive via elements and hat elements that comprise metal strips as radiating elements over a metallic ground plane. More specifically, by way of example, FIG. 7A illustrates an exemplary top-loaded monopole comprising a conductive via stub (70) and a metallic strip hat element (71), which form the antenna radiating element. Further, FIG. 7B illustrates an exemplary top-loaded monopole comprising a conductive via stub (70) and two equal-length metallic strip hat elements (72) and (73), which form the antenna radiating element. The use of metallic strips as hat elements allows the frequency to be easily adjusted by trimming the ends of the metallic strips to adjust the length of the monopole.

Figure 7C:
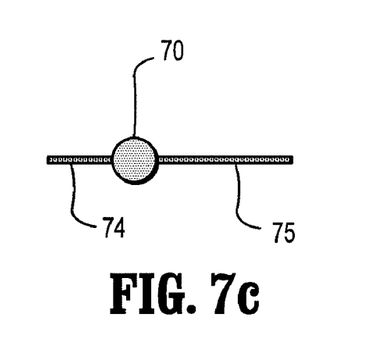

Moreover, the use of metallic strip hat elements enables multiband antennas to be formed using different length hat elements. For instance, as depicted in FIG. 7C, a dual-band antenna can be designed having an antenna radiating element comprising a conductive via stub (70) and different length metallic strip hat elements (74) and (75), wherein the conductive via stub (70) and hat element (74) have a first length that enables the antenna to operate at a first resonant frequency, and wherein the conductive via element (70) and hat element (75) have a second length that enables the antenna to operate at a second resonant frequency.

Figure 7D:
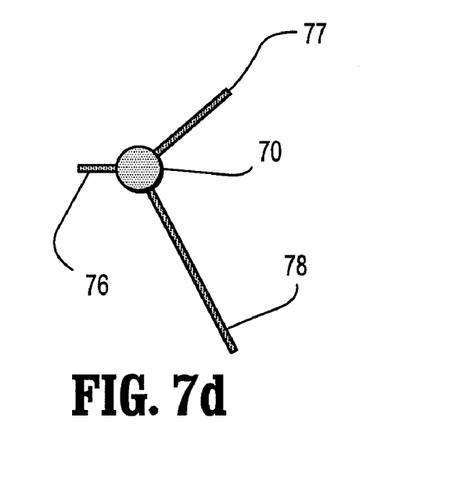

Further, FIG. 7D illustrates an exemplary tri-band antenna design having an antenna radiating element comprising a conductive via stub (70) and three different length metallic strip hat elements (76), (77) and (78). In this exemplary embodiment, the conductive via stub (70) and hat element (76) have a first length that enables the antenna to operate at a first resonant frequency, the conductive via element (70) and hat element (77) have a second length that enables the antenna to operate at a second resonant frequency, and the conductive via stub (70) and hat element (78) have a third length that enables the antenna to operate at a third resonant frequency.

Figure 3:
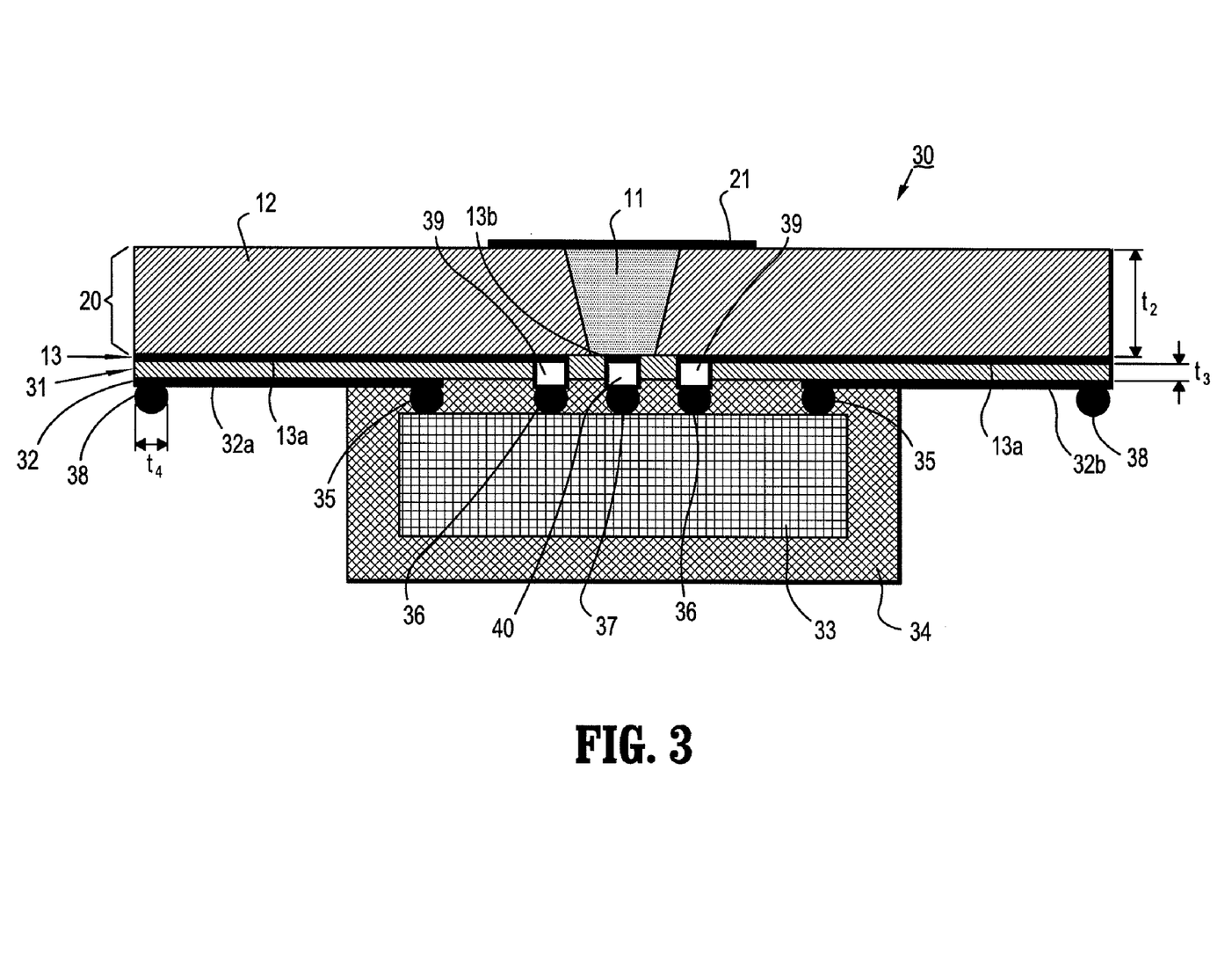
FIG. 3 is a schematic diagram illustrating an apparatus for integrally packaging an antenna and IC (integrated circuit) chip, according to an exemplary embodiment of the present invention.

It is to be further appreciated that antennas according to exemplary embodiments of the invention, such as depicted in FIGS. 1A-1B and 2, can be integrally packaged with IC chips in relatively small packages to construct RF or wireless communications chips. For example, FIG. 3 is a schematic diagram illustrating a cross-sectional view of an apparatus for integrally packaging an antenna and IC chip, according to an exemplary embodiment of the present invention. In general, the apparatus (30) comprises an antenna (20) having a framework as depicted in FIG. 2, which is flip-chip bonded to an IC chip (33) (e.g., IC transceiver) using a plurality of solder balls (35, 36, 37). The IC chip (33) is encapsulated with an encapsulation layer (34). The apparatus (30) further comprises a plurality of patterned insulation and metallic layers interposed between the antenna (20) and the IC chip (33) to enable formation of electrical connections between the antenna (20) and IC chip (33), as well as between the apparatus (30) and transmission lines of a carrier substrate (e.g., PC board) on which the apparatus (30) is mounted.

More specifically, in the exemplary embodiment of FIG. 3, an insulation layer (31) having a thickness (t3) is formed over the bottom surface of the antenna substrate (i.e., over the patterned conductive layer (13)). In exemplary embodiments of the invention, the insulation layer (31) may be formed of polyimide, silicon nitride, or other suitable materials, having a thickness $t_3$ of about 4-8 um. The insulation layer (31) comprises a plurality of conductive vias (39),(40) formed therein. The conductive vias (39) (or grounding vias) are connected to the ground plane (13a) of the antenna (20) adjacent the via stub (11). Solder balls (36) are formed on the grounding vias (39) for bonding to ground pads on the surface of the IC chip (33). Although only two conductive grounding vias (39) are depicted in FIG. 3, it is to be understood that three or more grounding vias (39) may be formed around the perimeter edge of the ground plane (13a) adjacent the via stub (11). In addition, the conductive via (40) is formed in the insulation layer (31) to connect to the contact pad (13b) formed on the bottom of the via stub (11). The solder ball (37) is formed on the conductive via (40) for bonding to an antenna feed pad or transmission line on the surface of the IC chip (33).

Furthermore, a conductive layer (32) (e.g., gold) is deposited over the insulation layer (31) and patterned to form various contact pads/transmission lines (e.g., 32a, 32b) for making electrical connections between the IC chip (33) and other components, pads, transmission lines, etc., on a PC board, for example. More specifically, by way of example, the transmission lines (32a) and (32b), each of which having solder balls (35) and (38) formed on end regions thereof, can be used for making ground, power or I/O connections, for example, wherein the solder balls (35) are used for bonding the transmission lines (32a, 32b) to desired connections on the surface of the IC chip (33) and the solder balls (38) are used for bonding the transmission lines (32a, 32b) to desired connections on a PC board. In such exemplary embodiment, the PC board can be fabricated to have a cutout in which the encapsulated IC chip (33) is inserted, as well as a plurality of patterned contact pads/transmission lines that contact the solder balls (38) when the apparatus (30) is inserted into and securely mounted in the PC board.

In other exemplary embodiments of the invention based on the antenna framework of FIG. 2, the dimensions of the antenna elements are as follows: $d_1$ is about 300 um, $d_2$ is about 150 um, $d_3$ is about 100 um, $d_4$ is about 200 um, $d_5$ is about 250 um to 450 um, and the diameter ($t_4$) of the solder balls 35, 36, 37, 38) is about 100 um.

In other exemplary embodiments of the invention, the apparatus (30) may comprise an impedance matching network for matching the impedances of the antenna (20) and a device/circuit (e.g., power amplifier) on the IC chip (33). For example, in one exemplary embodiment, an impedance matching network (e.g., a transmission line) may be integrally formed on the IC chip (33). For example, in the exemplary embodiment of FIG. 3, the solder ball (37) can be bonded to one end of a transmission line formed on the IC chip (33), wherein the transmission line is designed to provide the inductive/capacitive impedance matching between the antenna and a device/component connected to the other end of the transmission line.

In yet another exemplary embodiment of the invention, an impedance matching network may be formed using the interposing layers (31, 32). For example, an impedance matching transmission line (micro strip) may be patterned on the metallic layer (32). In such embodiment although not specifically shown in FIG. 3, the conductive via (40) would be connected to one end of the microstrip line that is pattered from the conductive layer (31) (as opposed to being directly bonded to the IC chip (33) via solder ball (37) as depicted), and the other end of the microstrip line would be bonded (via a solder ball) at another region of the IC chip (33).

Moreover, in other exemplary embodiments of the invention, other support circuitry, such as filters, can be formed using the interposing layers (31, 32), for example. Indeed, based on the teachings herein, one of ordinary skill in the art can readily envision other methods, devices or circuits that can be implemented herein for purposes of providing impedance matching, filtering, or other functions. It is to be understood that any high-frequency antenna (e.g., about 20 GHz or greater) that is constructed in accordance with the teachings of the present invention can be used for constructing an integrated communications chip, and that the use of the antenna (20) in FIG. 3 is merely one exemplary embodiment of the invention. In addition, the IC chip (33) depicted in FIG. 3 may comprise an integrated transceiver chip, an integrated receiver chip, an integrated transmitter chip, etc., and/or other IC chips comprising necessary support circuitry for implementing a communications chip package.

Further, in the exemplary integrated device of FIG. 3, the substrate (12) can act as the cover of the package (30) so no other lossy material on top of the antenna (20) will reduce the efficiency. Further, since the dielectric constant of the substrate (12) of the antenna is higher than air/vacuum, the EM (electromagnetic) fields tend to stay inside the substrate (12) and, thus, a significant portion of the radiated energy radiates out of the sides of the antenna (20) which should not be covered.

Those of ordinary skill in the art will readily appreciate the various advantages associated with antennas and integrated antenna packages according to embodiments of the invention. For instance, exemplary methods for constructing antennas, which implement accurate and efficient techniques for forming conductive vias in substrates, enable high-volume antenna manufacturing capability. Further, by having the monopole element (via stub 11) embedded in a substrate (12) and thus protected from damage, antenna designs according to the invention are robust and can be readily used with wireless devices (e.g. WPAN devices).

Moreover, integrated IC packages according to exemplary embodiments of the invention enable antennas to be integrally packaged with IC chips such as transceiver chips, which provide compact designs with very low loss between the transceiver and the antenna. In addition, such designs eliminate the need to go off the transceiver chip with high frequency input and output signals. In addition, antennas and integrated antenna packages according to the present invention enable a multitude of applications such as integrated phased array antenna systems, personal area networks, RADAR feeds, high reliability due to redundancy, point-to-point systems, etc. Moreover, the use of integrated antenna/IC chip packages according to the present invention saves significant space, size, cost and weight, which is a premium for virtually any commercial or military application.

It is to be understood that the exemplary embodiments of FIGS. 1A-1B, 2 and 3 are merely exemplary embodiments of antennas and IC packages according to the invention, and that one of ordinary skill in the art can readily envision other antenna types that can be constructed and packaged with IC chips using the devices and methods of the present invention.

Figure 5:
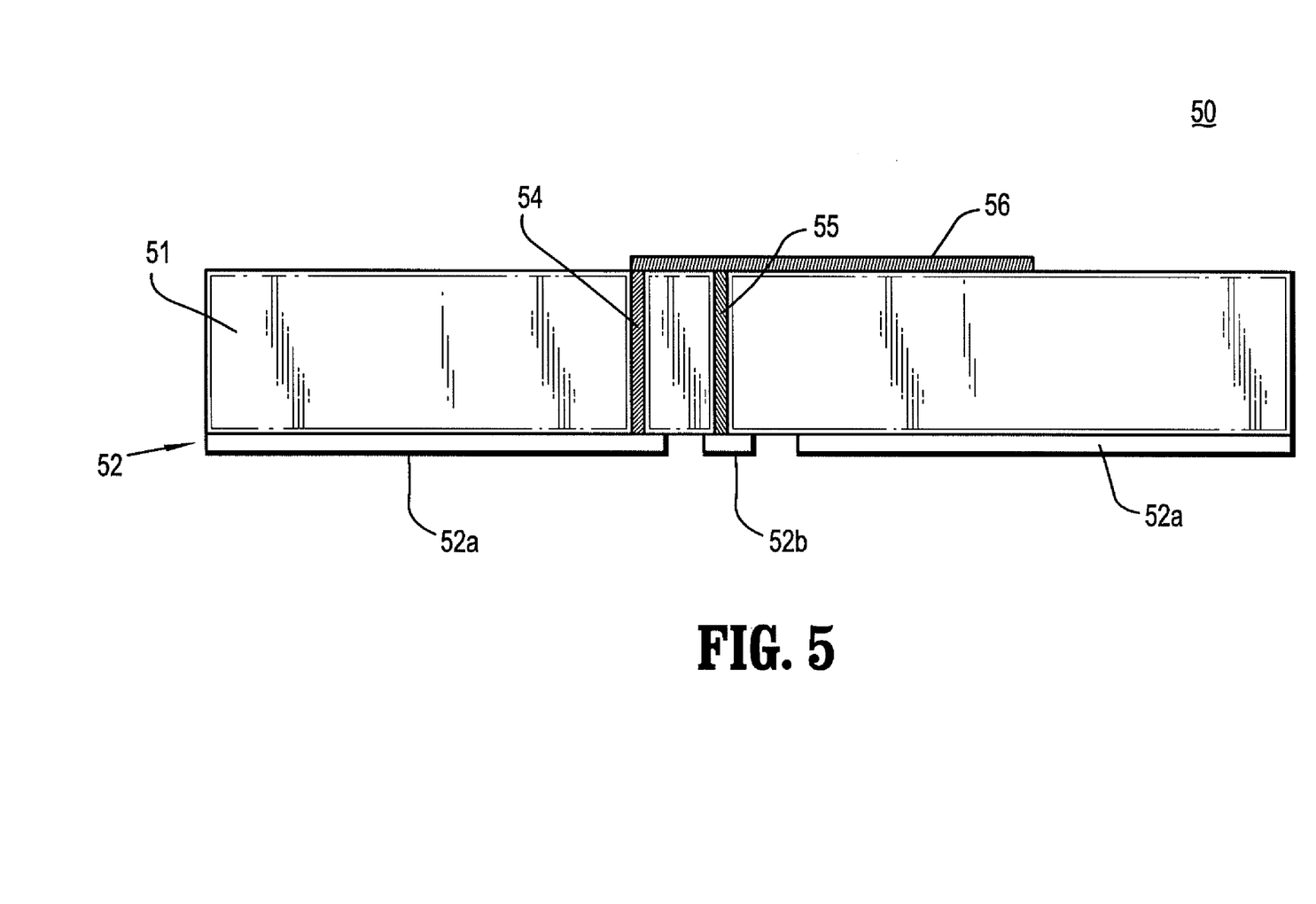
FIG. 5 is a schematic diagram illustrating an antenna according to another exemplary embodiment of the present invention.

For example, FIG. 5 illustrates an antenna according to another exemplary embodiment of the invention. More specifically, FIG. 5 depicts an inverted-F antenna (50) comprising a substrate (51) having a conductive layer (52) that is patterned to form a ground plane (52a) and contact pad (52b). The radiating elements of the antenna (50) comprise a first conductive via (54) and a second conductive via (55) formed in the substrate (51) and a top element (56) (metallic strip) that connects to the first and second vias (54) and (55). In one embodiment, the top element (56) is a metallic strip that is formed by depositing and patterning a conductive layer on top of the substrate (51). The first via (54) is connected to the ground plane (52a) and is used for grounding the antenna and the second conductive via (55) is connected to the contact page (52b) and used for feeding the antenna. The operation of inverted-F antennas are known in the art.

Figure 6:
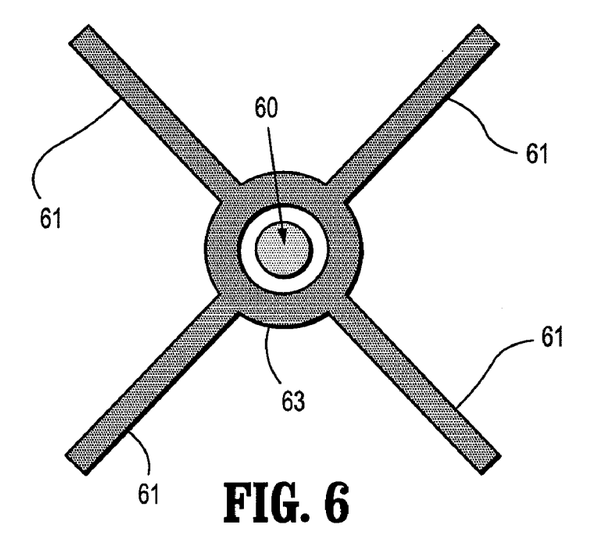
FIG. 6 is a schematic diagram illustrating an exemplary ground element for an antenna according to an exemplary embodiment of the present invention.

In addition, in other exemplary embodiments of the invention, antennas can be designed that do not necessarily include a conductive ground plane on one entire surface of the antenna substrate. For instance, FIG. 6 is an exemplary schematic diagram illustrating a bottom portion of a conductive via element (60) and a grounding element comprising radial elements (61) and annular element (63), which is formed on the bottom surface of a planar substrate.

Figure 8A:
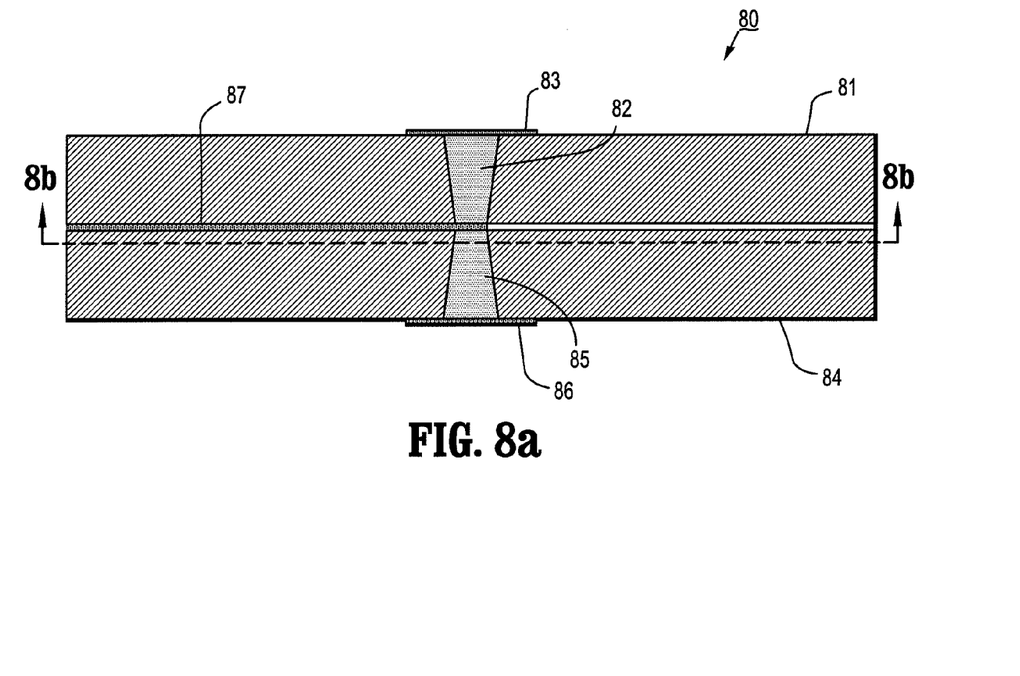
FIGS. 8A and 8B are schematic diagrams illustrating an antenna according to another exemplary embodiment of the invention.
Figure 8B:
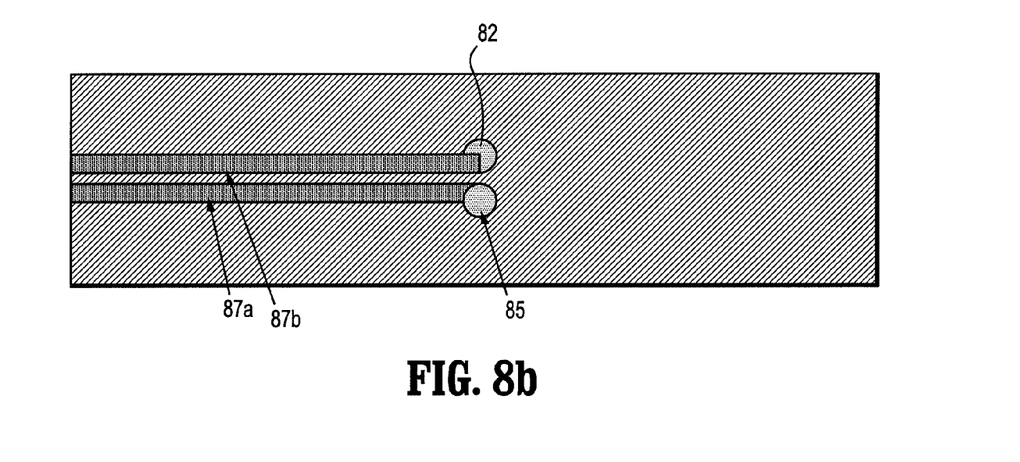

Moreover, FIGS. 8A and 8B illustrate an antenna design according to another exemplary embodiment of the invention, which does not require a ground plane formed on the surface of an antenna substrate. In particular, FIGS. 8A and 8B illustrate an exemplary dipole antenna (80), which is constructed by laminating two substrates each having a conductive via formed therein, and feeding the antenna from between the two substrates. More specifically, as depicted in FIG. 8A, the antenna (80) comprises a first substrate (81) comprising a radiating element including a conductive via stub (82) formed in the substrate (81) and a hat element (83) formed on a surface of the substrate (81). In addition, a second substrate (84) comprises radiating element including a conductive via stub (85) formed in the substrate (84) and a hat element (86) formed on a surface of the substrate (84). The substrates (81) and 84) are laminated to each other, with a differential feed (87) formed between the substrates for feeding the antenna (80).

FIG. 8B is illustrates a cross-sectional view of the antenna (80) of FIG. 8A along line 8B-8B. As depicted, conductive via stubs (82) and (85) are offset from each other, enabling a first feed element (87a) of the differential feed (87) to contact the bottom portion of the conductive via stub (85) and a second feed element (87b) to contact the bottom portion of the conductive via stub (82).

Figure 9A:
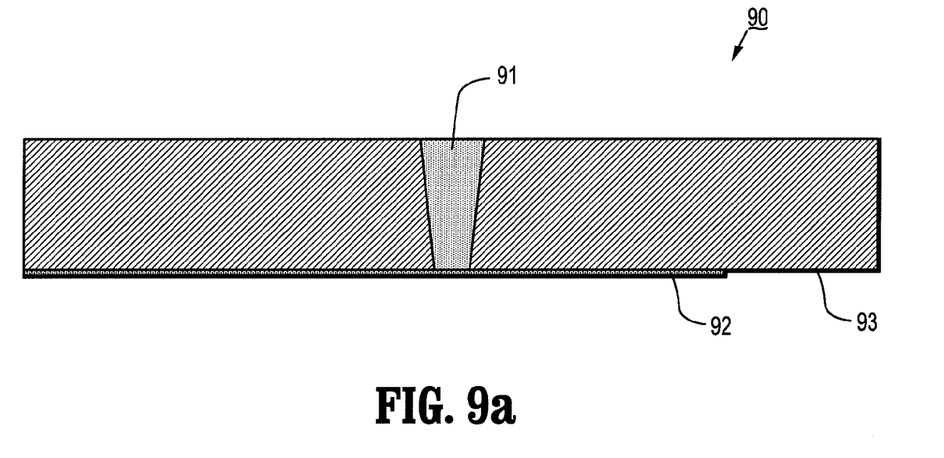
FIGS. 9A and 9B are schematic diagrams illustrating an antenna according to another exemplary embodiment of the invention.
Figure 9B:
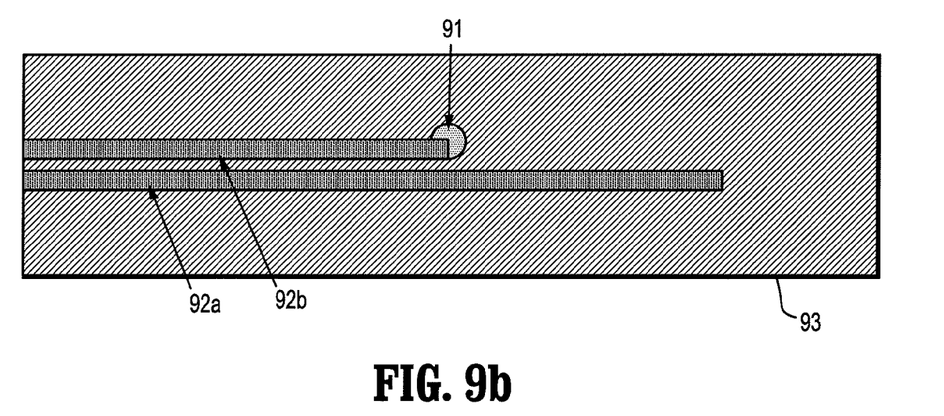

Furthermore, FIGS. 9A and 9B illustrate an antenna design according to yet another exemplary embodiment of the invention, which does not require a ground plane formed on the surface of an antenna substrate. In particular, FIGS. 9A and 9B illustrate an exemplary 90 degree dipole antenna (90), which is constructed using one substrate and a differential feed. More specifically, as depicted in FIG. 9A, the antenna (90) comprises a substrate (93) having a conductive via stub (91) and a differential feed (92) formed on a bottom surface of the substrate (93). FIG. 9B is a bottom view of the antenna (90) illustrating a bottom portion of the conductive via element (91) connected to a first feed element (92b) of the differential feed (92) and a second feed element (92*a*) which is formed to extend parallel with the first element (92*b*), but not directly connected to the via stub (91).

Figure 10:
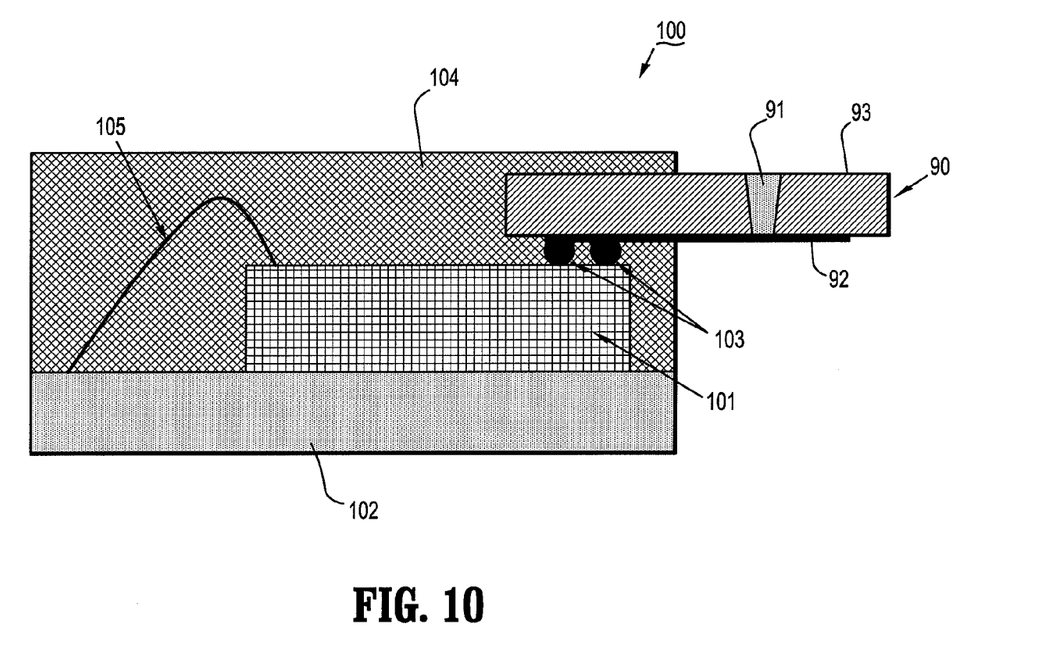
FIG. 10 is a schematic diagram illustrating an apparatus for packaging an antenna and an IC chip according to another exemplary embodiment of the invention.

FIG. 10 is a schematic diagram illustrating a cross-sectional view of an apparatus (100) for integrally packaging the exemplary antenna (90) of FIGS. 9A and 9B and an IC chip (101), according to an exemplary embodiment of the present invention. In general, the apparatus (100) apparatus comprises the antenna (90) bonded to the IC chip (101) (e.g., IC transceiver) using a plurality of solder balls (103) to connect the feed elements of the differential feed (92) to lines, contact, etc., on the IC chip (101). The IC chip (101) is bonded to a package base (102). One or more bond wires (105) are used for making I/O connections between the IC chip (101) and package base (102). The IC chip (101) and antenna (90) are encapsulated with an encapsulation layer (104), wherein a portion of the antenna (90) that includes the radiating element (91) protrudes from the sidewall of the encapsulate package.

Furthermore, in other exemplary embodiments of the invention, antennas can be constructed having an array of two or more vias formed in a substrate to provide an antenna with desired directivity for beamforming or beamsteering antenna applications. In general, a directive antenna beam pattern can be obtained using a phased array antenna, wherein the input signal phase to each of the via stub elements is controlled to electronically scan or steer the directive antenna pattern to a desired direction. It could also be placed in the center of a focusing antenna for directional antenna applications such as point-to-point systems or RADAR systems. Furthermore, it is to be appreciated that antenna designs according to exemplary embodiments of the invention can be implemented not only for MMW applications, but may also be used at lower frequencies. For example, a low frequency monopole antenna can be constructed by forming a via in a relatively thick PC board (e.g., FR4).

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

What is claimed is:

1. An antenna, comprising:
   a substrate; and
   a conductive via stub formed in the substrate, wherein the conductive via stub is a radiating element,
   wherein the substrate comprises a first surface and a second surface, the first and second surfaces defining planes that are substantially parallel, wherein the conductive via stub extends from the first surface to the second surface, the conductive via stub having a first diameter exposed at the first surface and a second diameter exposed at the second surface, the second diameter being greater than the first diameter, and the antenna further comprising a ground plane formed on the first surface of the substrate, the ground plane having an opening surrounding the conductive via stub and a contact pad disposed on the conductive via stub within the opening.

2. The antenna of claim 1, wherein the antenna is an omni-directional antenna or a directional antenna.

3. The antenna of claim 1, further comprising an impedance matching network, wherein the impedance matching network comprises:
   a insulation layer formed on the ground plane; and
   a conductive layer formed on the insulation layer, wherein the conductive layer is patterned to form the impedance matching network.

4. The antenna of claim 3, wherein the impedance matching network comprises a transmission line.

5. The antenna of claim 1, wherein the antenna has a resonant frequency of about 20 GHz or greater.

6. The antenna of claim 1, wherein the radiating element further comprises a hat element formed on one end of the conductive via stub.

7. The antenna of claim 1, wherein the substrate comprises a printed circuit board.

8. The antenna of claim 1, wherein the substrate is comprised of a dielectric material or a semiconductor material.

9. A wireless device having an antenna as defined in claim 1.

10. An integrated circuit package comprising an antenna as defined in claim 1.

11. An integrated communications device, comprising:
    an IC (integrated circuit) chip; and
    an antenna bonded to the IC chip, the antenna comprising:
      a substrate;
      a conductive via stub formed in the substrate, wherein the conductive via stub is a radiating element;
      a first surface and a second surface of the substrate, the first and second surfaces defining planes that are substantially parallel, wherein the conductive via stub extends from the first surface to the second surface, the conductive via stub having a first diameter exposed at the first surface and a second diameter exposed at the second surface, the second diameter being greater than the first diameter; and
      a ground plane formed on the first surface of the substrate, the ground plane having an opening surrounding the conductive via stub and a contact pad disposed on the conductive via stub within the opening.

12. The device of claim 11, wherein the IC chip comprises a transceiver, a receiver, or a transmitter.

13. The device of claim 11, further comprising a plurality of patterned layers between the antenna and IC chip for providing electrical interconnections.

14. The device of claim 13, wherein the plurality of patterned layers comprise:
    an insulation layer formed on a ground plane formed on a surface of the substrate of the antenna; and
    a conductive layer formed on the insulation layer, wherein the conductive layer is patterned to form a plurality of contact pads or transmission lines.

15. The device of claim 14, wherein the insulation layer comprises a plurality of grounding vias formed therein, wherein the grounding vias provide ground connections between the IC chip and the ground plane of the antenna.

16. The device of claim 14, wherein the insulation layer comprises a feeding via formed therein, wherein the feeding via provides a connection to the radiating element of the antenna.

17. The device of claim 14, further comprising an impedance matching network that is formed from the plurality of patterned layers.

18. The device of claim 17, wherein the impedance matching network comprises a microstrip transmission line patterned on the conductive layer.

19. The device of claim 11, wherein the antenna is an omni-directional antenna or a directional antenna.

20. The device of claim 11, wherein the antenna has a resonant frequency of about 20 GHz or greater.

21. The device of claim 11, wherein the at least one radiating element of the antenna further comprises a hat element formed on the conductive via stub opposite the ground plane.

22. A wireless device having an integrated device as defined in claim 11.

* * * * *